United States Patent [19]

Pelc

[11] Patent Number: 5,101,156
[45] Date of Patent: Mar. 31, 1992

[54] RAPID FLOW MEASUREMENT USING AN NMR IMAGING SYSTEM

[75] Inventor: Norbert J. Pelc, Los Altos, Calif.

[73] Assignee: General Electric, Milwaukee, Wis.

[21] Appl. No.: 564,513

[22] Filed: Aug. 9, 1990

[51] Int. Cl.$^5$ ............................................. G01R 33/20
[52] U.S. Cl. .................................... 324/306; 324/300
[58] Field of Search ............... 324/306, 300, 307, 309, 324/318, 322; 128/653 R, 653 A, 653 AF

[56] References Cited

U.S. PATENT DOCUMENTS

| | | | |
|---|---|---|---|
| 3,191,119 | 6/1965 | Singer | 324/306 |
| 3,419,793 | 12/1968 | Genthe et al. | 324/306 |
| 3,559,044 | 1/1971 | Heyden | 324/306 |
| 4,516,582 | 5/1985 | Redington | 128/653 |
| 4,532,473 | 7/1985 | Wehrli | 324/306 |
| 4,574,239 | 3/1986 | Singer | 324/306 |
| 4,609,872 | 9/1986 | O'Donnell | 324/306 |
| 4,621,234 | 11/1986 | Caprihan | 324/306 |
| 4,629,987 | 12/1986 | King et al. | 324/306 |
| 4,683,431 | 7/1987 | Pattany et al. | 324/306 |
| 4,689,560 | 8/1987 | Nayler et al. | 324/306 |
| 4,777,957 | 10/1988 | Wehrli et al. | 128/653 |
| 5,022,397 | 6/1991 | Dumoulin | 128/653 AF |

Primary Examiner—Michael J. Tokar
Attorney, Agent, or Firm—Quarles & Brady

[57] ABSTRACT

An NMR system measures the velocity of flowing spins in the presence of stationary spins by performing three separate measurement cycles. The first cycle is a reference, the second cycle includes a magnetic field gradient having an incremental, flow sensitizing first moment $\Delta M_1$, and a third measurement cycle includes a magnetic field gradient having an incremental flow sensitizing first moment $-\Delta M_1$. The resulting NMR signals are processed to produce a velocity measurement.

7 Claims, 5 Drawing Sheets

RAPID FLOW MEASUREMENT USING AN NMR IMAGING SYSTEM

BACKGROUND OF THE INVENTION

The field of the invention is nuclear magnetic resonance imaging methods and systems. More particularly, the invention relates to a method for producing NMR images of flowing or moving subjects.

Any nucleus which possesses a magnetic moment attempts to align itself with the direction of the magnetic field in which it is located. In doing so, however, the nucleus processes around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned procession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well known, the NMR signal may be a free indication decay (FID) or, preferably, a spin-echo signal.

The preferred embodiments of the invention will be described in detail with reference to a variant of the well known FT technique, which is frequently referred to as "spin-warp". The spin-warp technique is discussed in an article entitled "Spin Warp NMR Imaging and Applications to Human Whole-Body Imaging" by W. A. Edelstein et al., *Physics in Medicine and Biology*, Vol. 25, pp. 751-756 (1980).

Briefly, the spin-warp technique employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a read-out magnetic field gradient ($G_x$) in a direction orthogonal to the phase encoding direction. The read-out gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793; and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed in to the volume or slice. Examples of this method are described in U.S. Pat. Nos. 4,574,239; 4,532,473; and 4,516,582.

A third technique for measuring motion or flow relies upon the fact that an NMR signal produced by spins flowing through a magnetic field gradient exhibits a phase shift which is proportional to velocity. For flow that has a roughly constant velocity during the measurement cycle the change in phase of the NMR signal is given as follows:

$$\Delta \phi = \gamma M_1 v \qquad (1)$$

where $M_1$ is the first moment of the magnetic field gradient, $\gamma$ is the gyromagnetic ratio and $v$ is the velocity of the spins. To eliminate errors in this measurement due to phase shifts caused by other sources, it is common practice to perform the measurement at least twice with different magnetic field gradient moments as described in U.S. Pat. No. 4,609,872. The difference in phase at any location between the two measurements is then as follows:

$$\Delta \phi = \gamma \Delta M_1 v \qquad (2)$$

By performing two complete scans with different magnetic field gradient moments and subtracting the measured phases in the reconstructed image at each location in the acquired data arrays, a phase map is produced which accurately measures the velocity of constantly moving spins.

As discussed above, a complete scan is comprised of many views, each with a slightly different position encoding magnetic field gradient pulse. For example, in the spin warp pulse sequence, each view has a different phase encoding gradient pulse amplitude and a complete scan is carried out by executing a series of such views. For the above described velocity imaging method to work properly, the velocity present during the entire scan must be substantially constant. However, in human subjects that is not the case because blood flows in a pulsatile manner as a function of the cardiac cycle and the velocity is different from view-to-view during the scan. Such variations in spin velocity will produce phase shifts that result in the generation of image artifacts unless precautions are taken. Such precautions include using a cardiac gating method as described in U.S. Pat. No. 4,751,462 or a fast scan technique as described in U.S. Pat. No. 4,710,717. However, both of these methods require a lengthy data acquisition time.

Equation (2) above is only accurate when all of the spins within each voxel are moving at the same constant velocity. Unfortunately, in medical imaging it is almost always the case that the field of interest contains both stationary and moving spins and that the velocity measurements will be distorted by the stationary spins. One known solution to this problem is to make the phase measurements with many different magnetic field gradient moments and perform a Fourier transformation with respect to these measurements. While this "MR Doppler" procedure gives a velocity distribution of the spins at each voxel, it also requires considerably more time to gather the data.

SUMMARY OF THE INVENTION

The present invention is a method and apparatus for measuring the weighted average velocity of moving spins which are intermixed with stationary spins. More specifically, the invention includes making an NMR measurement with a reference magnetic field gradient moment and storing the resulting NMR signal $S_1$, making a second NMR measurement with a magnetic field gradient moment incremented by $\Delta M_1$ and storing the resulting NMR signal $S_2$, making a third NMR measurement with a magnetic field gradient moment incremented by $-\Delta M_1$ and storing the resulting NMR signal $S_3$, calculating the difference $(S_1 - S_2)$ between the first and second NMR signals $S_1$ and $S_2$, calculating the difference $(S_1 - S_3)$ between the first and third NMR signals $S_1$ and $S_3$, calculating the complex ratio (R) of the differences $(S_1 - S_2)$ and $(S_1 - S_3)$, and calculating the velocity of the moving spins by dividing the phase of the complex ratio R by a value proportional to the change in the magnetic field gradient moment $\Delta M_1$ and to the gyromatic ratio $\gamma$ of the spins.

A general object of the invention is to measure the weighted average velocity of the moving spins without inaccuracies caused by the presence of stationary spins. Rather than making two NMR measurements and calculating velocity from the phase differences, the present invention contemplates a series of three NMR measurements and a set of calculations which measure velocity based on phase differences caused only by the moving spins. As a result, the inaccuracies caused by averaging into the result the zero velocity of large numbers of stationary spins is eliminated.

Another object of the invention is to accurately measure and image pulsatile flow without the need for cardiac gating methods. The three measurements can be made in rapid sequence for each view of the scan, so that the velocity of the spins will remain substantially unchanged during each view.

Another object of the invention is to improve the accuracy of NMR velocity measurements without unduly lengthening the scan time. A conventional velocity measurement sequence requires at least two separate measurements, while the present invention requires a third. The scan time for each measurement is substantially the same so that the present invention causes a 50% increase in the total scan time. This is substantially less than the scan time required by MR Doppler techniques.

The present invention enables the flow of moving spins in the presence of stationary spins to be measured accurately and quickly. The first step is to make a reference measurement which produces an NMR signal $S_1$ that is:

$$S_1 = S_s + S_m \quad (3)$$

where $S_s$ is the complex signal produced by stationary spins, $S_m$ is the complex signal produced by moving spins, including any phase shift between static and moving spins due to inhomogeneities in the magnetic fields.

A second measurement is then made with a velocity sensitizing magnetic field gradient having an incremented first moment equal to $\Delta M_1$. The resulting signal $S_2$ is as follows:

$$S_2 = S_s + S_m e^{i\phi} \quad (4)$$

where
$\phi = \gamma \Delta M_1 v$;
$v$ = velocity of the moving spins;
$\gamma$ = gyromagnetic ratio of the spins; and
$\Delta M_1$ = increment in the first moment of the magnetic field gradient.

A third measurement is then made with a velocity sensitizing magnetic field gradient having an incremental first moment equal to $-\Delta M_1$. The resulting signal $S_3$ is as follows:

$$S_3 = S_s + S_m e^{-i\phi} \quad (5)$$

The difference between $S_1$ and $S_2$ and $S_1$ and $S_3$ is then calculated and may be expressed as follows:

$$S_1 - S_2 = S_m[1 - e^{i\phi}] \quad (6)$$

$$S_1 - S_3 = S_m[1 - e^{-i\phi}] \quad (7)$$

The negative of the complex ratio of these two differences is then calculated to yield:

$$R = -\frac{S_1 - S_2}{S_1 - S_3} = \frac{1 - e^{i\phi}}{1 - e^{-i\phi}} \quad (8)$$

This ratio reduces to the following when the top and bottom are multiplied by $(1 - e^{i\phi})$:

$$R = -\frac{(1 - e^{i\phi})^2}{2(1 - \cos(\phi))} = e^{i\phi} \quad (9)$$

where we have used the fact that $e^{i\phi} = \cos(\phi) + i\sin(\phi)$. The arc tangent of R is thus equal to the incremental phase shift experienced by the moving spins, or in other words:

$$\text{phase}\left(-\frac{S_1 - S_2}{S_1 - S_3}\right) = \phi = \gamma \Delta M_1 v \quad (10)$$

This phase can be calculated as the arc tangent of the ratio of the imaginary part of $-(S_1-S_2)/(S_1-S_3)$ to the real part of the same expression. Dividing the calculated value of $\phi$ by $\gamma \Delta M_1$ yields a value for the velocity of the moving spins which is equal to the weighted average velocity of the moving spins, unaffected by the static spins. The arc tangent of Eq. 10 is preferably a four quadrant arc tangent, such as ATAN2 in the FORTRAN computer language.

Yet another object of the invention is to provide a simplified and rapid method for measuring velocity in a vessel. By performing three measurements at a specific phase encoding value and performing a single dimension Fourier transformation in the readout direction, the velocity at a specific location can be calculated. If this location corresponds with the location of a blood vessel, the velocity of blood in the vessel can be quickly calculated using the present invention.

Yet another object of the invention is to provide a method for producing NMR data from which a conventional image can be reconstructed and from which the velocity of moving spins can be calculated at any location in the image.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
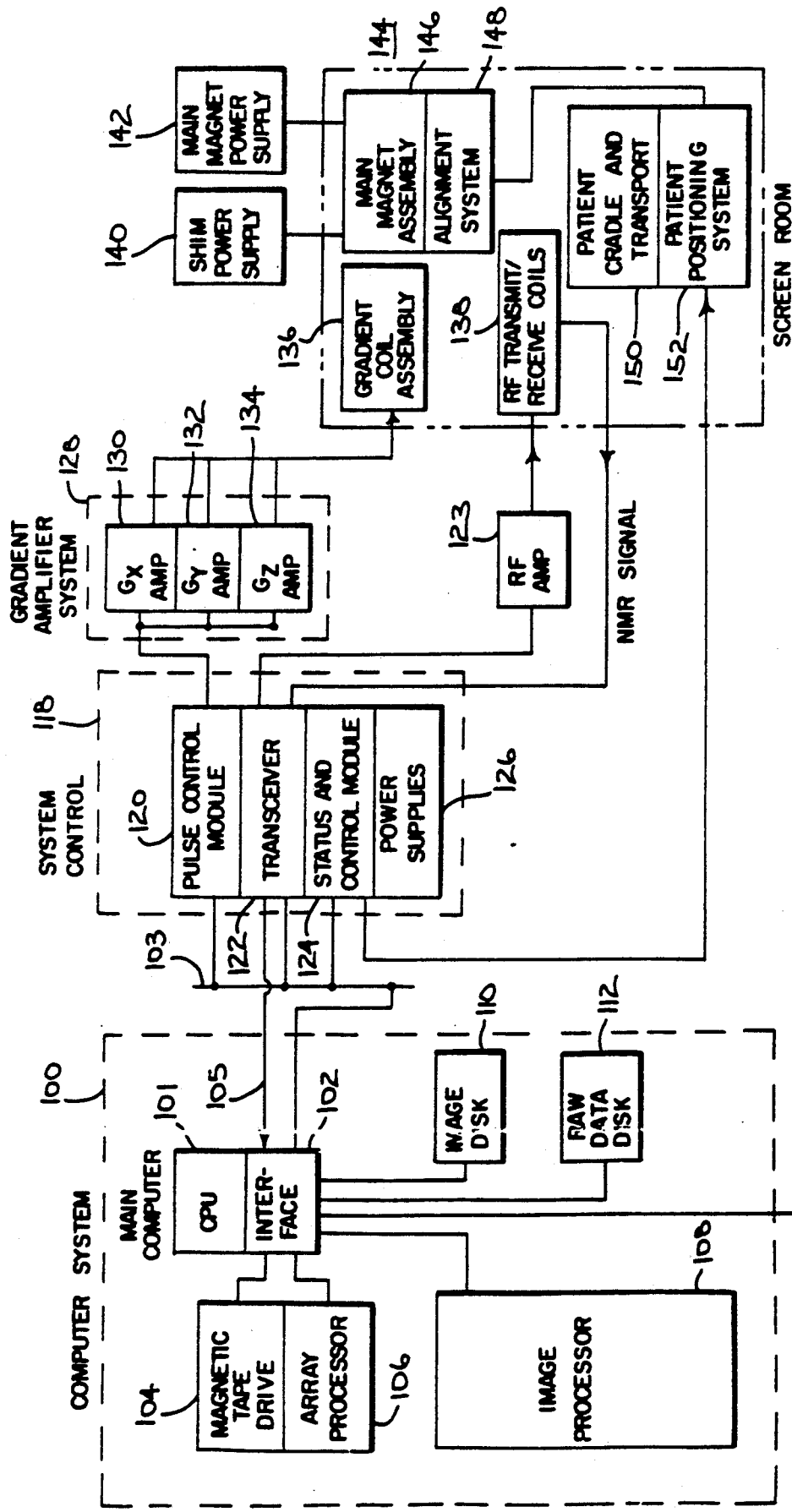
FIG. 1 is a block diagram of an NMR system which employs the present invention.

Referring to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (a Data General MV4000). The computer 100 includes an interface 102 through which a plurality of computer peripheral devices and other NMR system components are coupled to the main computer 101. Among the computer peripheral devices is a magnetic tape drive 104 which may be utilized under the direction of the main computer 101 for achieving patient data and image data to tape. Processed patient data may also be stored in an image disc storage device designated 110. An array processor 106 is utilized for preprocessing acquired NMR data and for image reconstruction. The function of image processor 108 is to provide interactive image display manipulation such as magnification, image comparison, gray-scale adjustment and real time data display. The computer system 100 also includes a means to store raw NMR data (i.e. before image construction) which employs a disc data storage system designated 112. An operator console 116 is also coupled to the main computer 101 by means of interface 102, and it provides the operator with the means to input data pertinent to a patient study as well as additional data necessary for proper NMR system operation, such as calibrating, initiating and terminating scans. The operator console is also used to display images stored on disc or magnetic tape.

The computer system 100 exercises control over the NMR system by means of a system control 118 and a gradient amplifier system 128. Under the direction of a stored program, the computer 100 communicates with system control 118 by means of a serial communication network 103 (such as the Ethernet network) in a manner well known to those skilled in the art. The system control 118 includes several subsystems such as a pulse control module (PCM) 120, a radio frequency transceiver 122, a status control module (SCM) 124, and power supplies generally designated 126. The PCM 120 utilizes control signals generated under program control by main computer 101 to generate digital waveforms which control gradient coil excitation, as well as RF envelope waveforms utilized in the transceiver 122 for modulating the RF excitation pulses. The gradient waveforms are applied to the gradient amplifier system 128 which is comprised of $G_x$, $G_y$ and $G_z$ amplifiers 130, 132 and 134, respectively. Each amplifier 130, 132 and 134 is utilized to excite a corresponding gradient coil in an assembly designated 136 which is part of a magnet assembly 146. When energized, the gradient coils generate magnetic field gradients $G_x$, $G_y$ and $G_z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency signal to an RF power amplifier 123 which then energizes RF coils 138 which are situated within main magnet assembly 146. The NMR signals radiated by the excited spin in the patient are sensed by the same or a different RF coil than is used for transmitting. The signals are detected, amplified, demodulated, filtered, and digitized in the receiver section of the transceiver 122. The processed signals are transmitted to the main computer 101 by means of a dedicated, unidirectional, high-speed digital link 105 which links interface 102 and transceiver 122.

The PCM 120 and SCM 124 are independent subsystems both of which communicate with main computer 101, peripheral systems, such as patient positioning system 152, as well as to one another by means of serial communications link 103. The PCM 120 and SCM 124 are each comprised of a 16-bit microprocessor (such as Intel 8086) for processing commands from the main computer 101. The SCM 124 includes means for acquiring information regarding patient cradle position, and the position of the movable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148, a shim coil power supply 140, and a main magnet power supply 142. The main power supply 142 is utilized to bring the polarizing field produced by the magnet to the proper operating strength of 1.5 Tesla and is then disconnected.

To minimize interference from external sources, the NMR system components comprised of the magnet, the gradient coil assembly, and the RF transmit and receiver coils, as well as the patient-handling devices, are enclosed in an RF shielded room generally designated 144. The shielding is generally provided by a copper or aluminum screen network which encloses the entire room. The screen network serves to contain the RF signals generated by the system, while shielding the system from RF signals generated outside the room.

Figure 2:
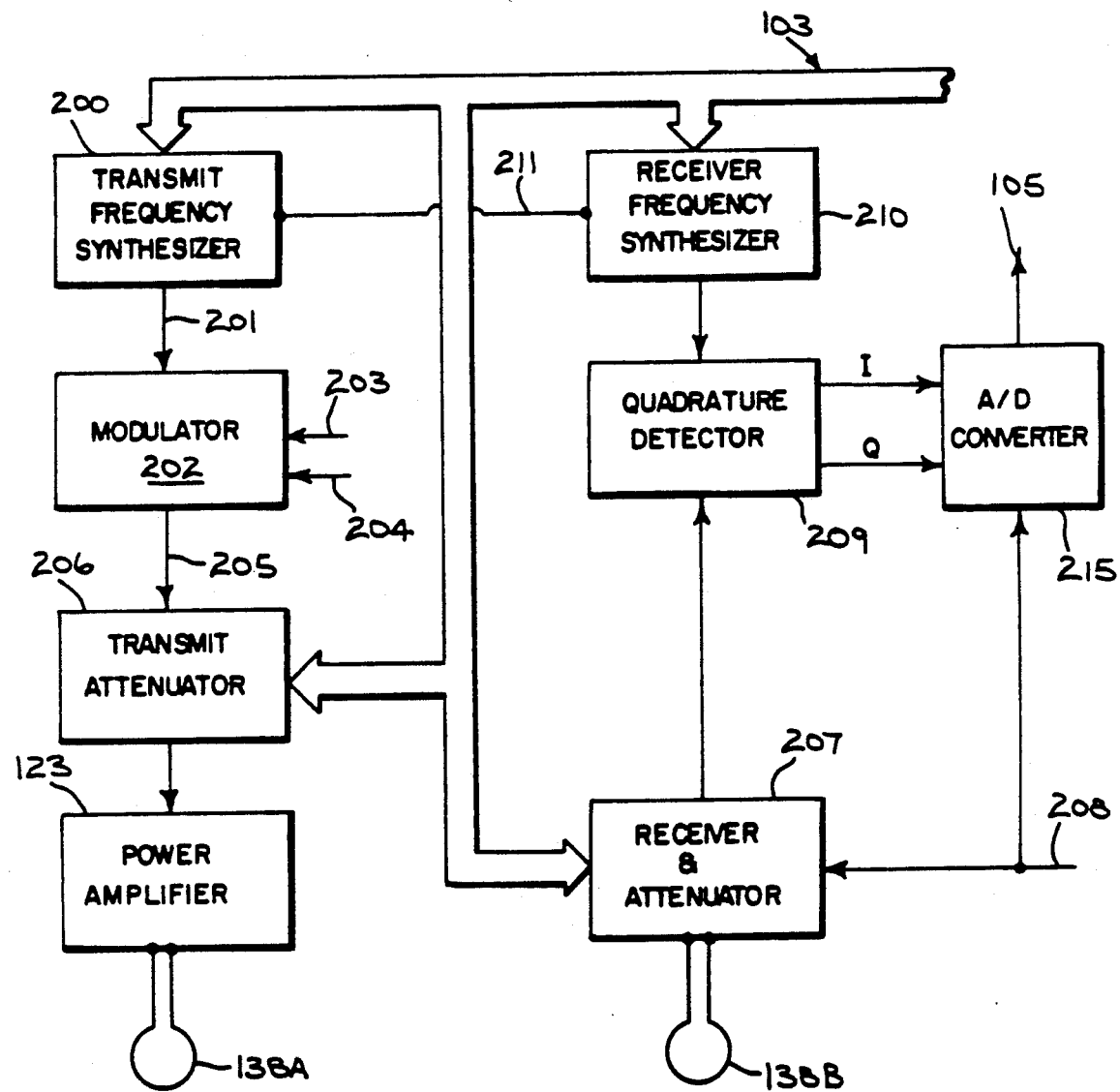
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 38B. The base, or carrier, frequency of the RF excitation field is produced by a frequency synthesizer 200 which receives a set of digital signals through the communications link 103 from the main computer 101. These digital signals indicate the frequency which is to be produced at an output 201 at a resolution of one Hertz. This commanded RF carrier is applied to a modulator 202 where it is frequency and amplitude modulated in response to signals received through line 203, and the resulting RF excitation signal is turned on and off in response to a control signal which is received from the PCM 120 through line 204. The magnitude of the RF excitation pulse output through line 205 is attenuated by a transmit attenuator circuit 206 which receives a digital signal from the main computer 101 through communications link 103. The attenuated RF excitation pulses are applied to the power amplifier 123 that drives the RF transmitter coil 138A.

Referring still to FIGS. 1 and 2, the NMR signal produced by the excited spins in the subject is picked up by the receiver coil 138B and applied to the input of a receiver 207. The receiver 207 amplifies the NMR signal and this is attenuated by an amount determined by a digital attenuation signal received from the main computer 101 through link 103. The receiver 207 is also turned on and off by a signal through line 208 from the PCM 120 such that the NMR signal is acquired only over the time intervals required by the particular acquisition being performed.

The received NMR signal is demodulated by a quadrature detector 209 to produce two signals I and Q that are coupled through anti-aliasing filters 216 and 217 to a pair of analog to digital converters indicated collectively at 218. The quadrature detector 209 also receives an RF reference signal from a second frequency synthesizer 210 and this is employed by the quadrature detector 209 to sense the amplitude of that component of the NMR signal which is in phase with the RF reference (I signal) and the amplitude of that component of the NMR signal which is in quadrature therewith (Q signal).

The I and Q components of the received NMR signal are continuously sampled and digitized by the A/D converter 218 at a sample rate of 32 kHz throughout the acquisition period. A set of 256 digital numbers are simultaneously acquired for each I and Q component of the NMR signal, and these digital numbers are conveyed to the main computer 101 through the serial link 105. Each sample pair is thought of as a complex number I+iQ.

Figure 3A:
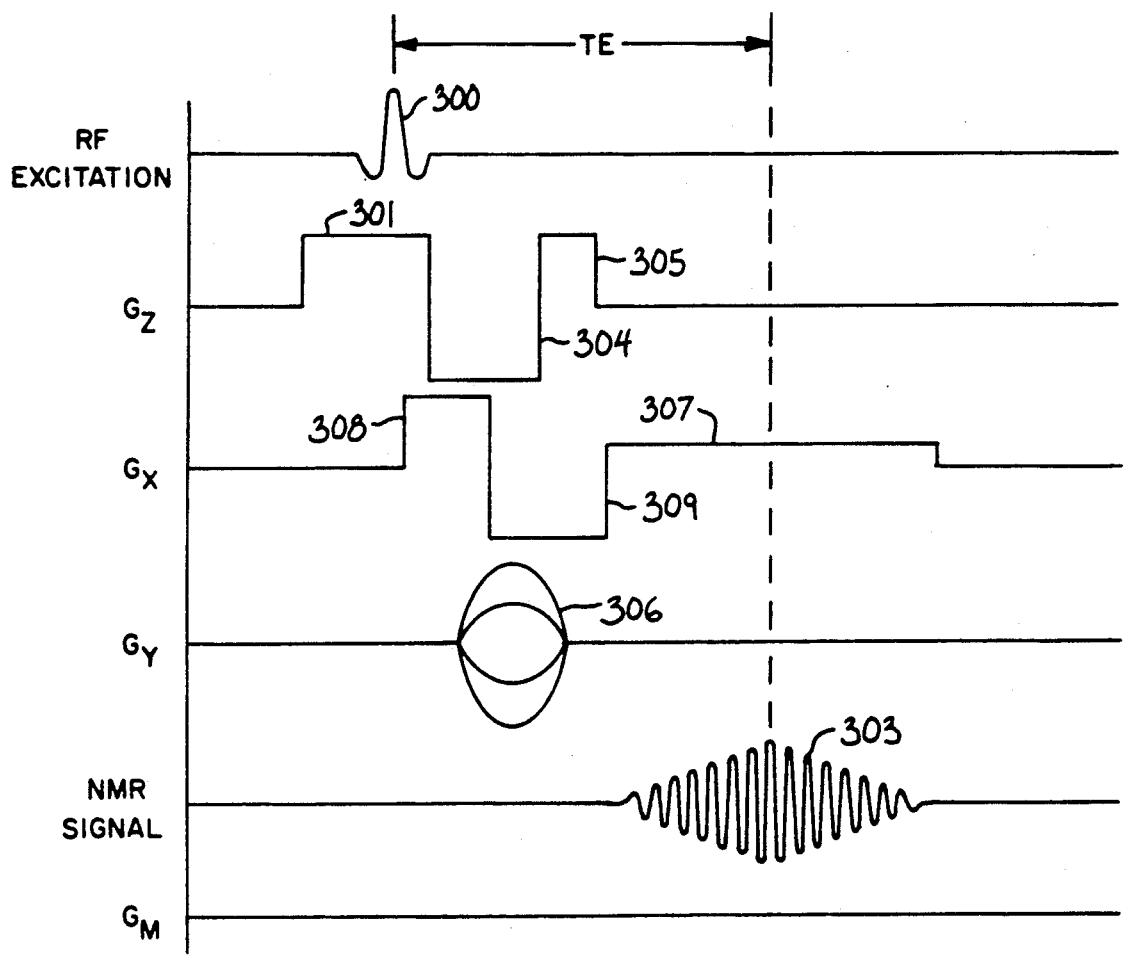
FIGS. 3A, 3B, and 3C are graphic representations of the NMR pulse sequences used to acquire data to produce a velocity image.

The NMR system of FIG. 1 performs a series of pulse sequences to collect sufficient NMR data to reconstruct the desired velocity image. Referring particularly to FIG. 3A, the first pulse sequence is a conventional first order moment nulled gradient echo sequence in which a selective RF excitation pulse 300 is applied to the subject in the presence of a $G_z$ slice select gradient pulse 301. The excitation pulse 300 has a flip angle $\alpha$, with a typical value of $\alpha$ being 30°. To compensate the FID for the phase shifts caused by the slice select gradient pulse 301 and to desensitize the FID to velocity along the z axis, a negative $G_z$ gradient pulse 304 followed by a positive $G_z$ gradient pulse 305 are produced by the $G_z$ gradient coils. For example, one solution is to use a pulse 304 of the same width, but opposite sign, as the pulse 301, and the pulse 305 is one half the width and the same height as the pulse 301. While the pulses 304 and 305 compensate for velocity along the z axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to locate the position of the spins producing the NMR signal along the y axis. Position along the x-axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ read gradient pulse 307 remains at a constant value during the entire scan. To produce the gradient echo 303 and to desensitize it to velocity along the x axis, gradient pulses 308 and 309 are produced prior to the pulse 307. Although there are a number of well known strategies to accomplish this; in one solution the pulse 309 is of the same width, but opposite polarity as the pulse 307.

As is explained in more detail below, to practice the present invention, three complete data sets, each with different flow sensitivity along one direction, are needed. In the preferred embodiment data for the three sets is acquired in an interleaved fashion. In this approach, three measurements with different flow sensitivity are acquired with one value of the phase encoding gradient. The phase encoding value is then changed and three measurements are made at this new phase encoding value with the three flow sensitivities. This process continues until all the phase encoding values have been used. The acquired data is then reordered into three data sets, each with one of the three flow sensitivities. While this interleaved approach is preferred because it minimizes effects due to the other motion (e.g. respiratory), in the following discussion the invention is described as if the three data sets are each completely acquired prior to the next flow encoding being used.

The NMR signal 303 is acquired by the system transceiver 122 and digitized into a row of 256 complex numbers which are stored in the memory of the main computer 101. For each value of the $G_y$ phase encoding gradient an NMR signal 303 is produced, acquired, digitized and stored in a separate row of 256 complex numbers. At the completion of the scan, therefore, a two-dimensional (256×256) matrix of complex numbers is stored in the computer 101. These NMR signals which are produced when no flow sensitizing gradients are applied may be Fourier transformed into a conventional NMR image. These flow compensated signals are referred to herein as the signal $S_1$. The important fact about the NMR signals $S_1$ is that no additional velocity sensitizing gradient moments are included in the pulse sequence. This is represented in FIG. 3A by the gradient $G_M$ which is zero throughout the first scan.

Figure 3B:
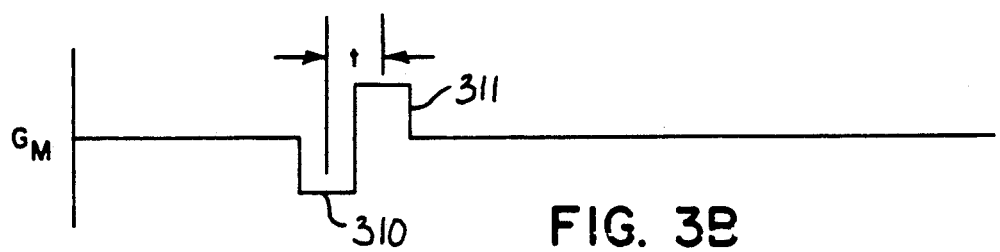

After the array of $S_1$ signals has been acquired during the first scan, a second scan is conducted to acquire a second array of signals $S_2$. The pulse sequence used is the same as that shown in FIG. 3A, except the gradient $G_M$ now has a value which sensitizes the signals $S_2$ to velocity along the direction of $G_M$. This is illustrated in FIG. 3B, where $G_M$ has a bipolar waveform comprised of a negative gradient pulse 310 followed by a positive gradient pulse 311. The area (A) defined by each pulse 310 and 311 is the same, and the centers of each gradient pulse 310 and 311 are spaced from one another by a time interval (t). The incremental moment ($\Delta M_1$) provided by the $G_M$ gradient is, therefore $\Delta M_1 = A \times t$, and this gradient moment $\Delta M_1$ is applied after the application of the RF excitation pulse 300 and before the acquisition of the signal 303. While the gradient moment $G_M$ is illustrated as a separate gradient magnetic field, in fact, it is produced by the same coils which produce the $G_x$, and $G_y$ and $G_z$ gradient fields. By combining $G_x$, and $G_y$ and $G_z$ gradient fields of the proper amplitude, the gradient moment $G_M$ can be oriented in any direction in space in order to sensitize for flow in that direction. For example, it is quite common to sensitize for flow in the slice selection direction, in which case the gradient moment $G_M$ is produced solely by the $G_z$ gradient coil.

Figure 3C:
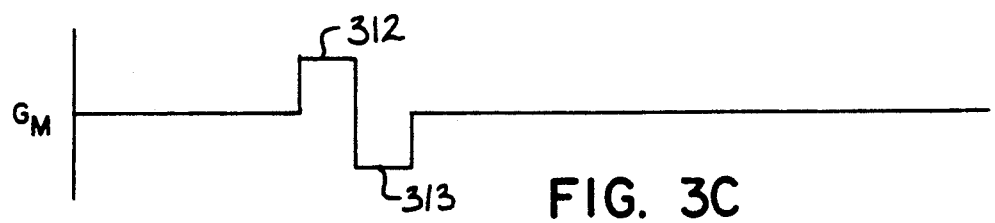

After the second array of NMR signals $S_2$ have been acquired and stored, a third array of signals $S_3$ are acquired. This is done during a third scan in which the pulse sequence of FIG. 3A is employed, but the gradient moment $G_M$ is altered as shown in FIG. 3C to produce a moment of $-\Delta M_1$. This is accomplished with gradient pulse 312 and 313 which are identical, but opposite in direction to the gradient pulses 310 and 311. After the 256 NMR signals $S_3$ have been acquired and stored in the computer 101, the data acquisition phase is completed and the data processing phase is commenced.

It should be apparent to those skilled in the art that many variations in the data acquisition phase of the invention are possible. Other NMR pulse sequences can be employed. In addition, as was mentioned previously, the acquisition of the three data sets $S_1$, $S_2$ and $S_3$ can be interleaved. For example, all three signals $S_1$, $S_2$ and $S_3$ can be acquired in succession for each value of phase encoding gradient $G_y$. Also, multiple sequences may be conducted at each phase encoding gradient $G_y$ in order to improve signal-to-noise or to cancel system errors as described in U.S. Pat. No. 4,443,760. There are also many different ways to produce the gradient moment $\Delta M_1$ using the gradient $G_M$. For example, the gradient pulses 310–313 can be shaped differently, or they may be separated in time to increase the incremental first moment $\Delta M_1$. Also, it is possible to employ spin echo sequences which use 180° RF pulses to refocus the undesirable effects of static magnetic field inhomogeneities. If 180° pulses are used, as is known to those skilled in the art, the incremental first moment can be produced by gradient lobes of the same polarity placed on opposite sides of the 180° RF pulse. Furthermore, the key distinction between the pulse sequences that are used to produce $S_1$, $S_2$ and $S_3$ is the first moment of the gradient waveform along the direction motion is to be measured. In the preferred embodiment the first data set $S_1$ was acquired with a moment nulled sequence. This need not be the case. As long as the first moment of the pulse sequence used to acquire $S_2$ is $\Delta M_1$ larger than that used to acquire $S_1$ and the first moment used to acquire $S_3$ is $\Delta M_1$ lower than that used for $S_1$, the proper data will be acquired. Also, the moment change can be accomplished by altering the amplitude of existing pulses in the sequence, rather than the insertion of additional pulses. Of course, to produce the opposite moment $-\Delta M_1$, the incremental amplitude alteration of both gradient pulses would be reversed in polarity.

Figure 4:
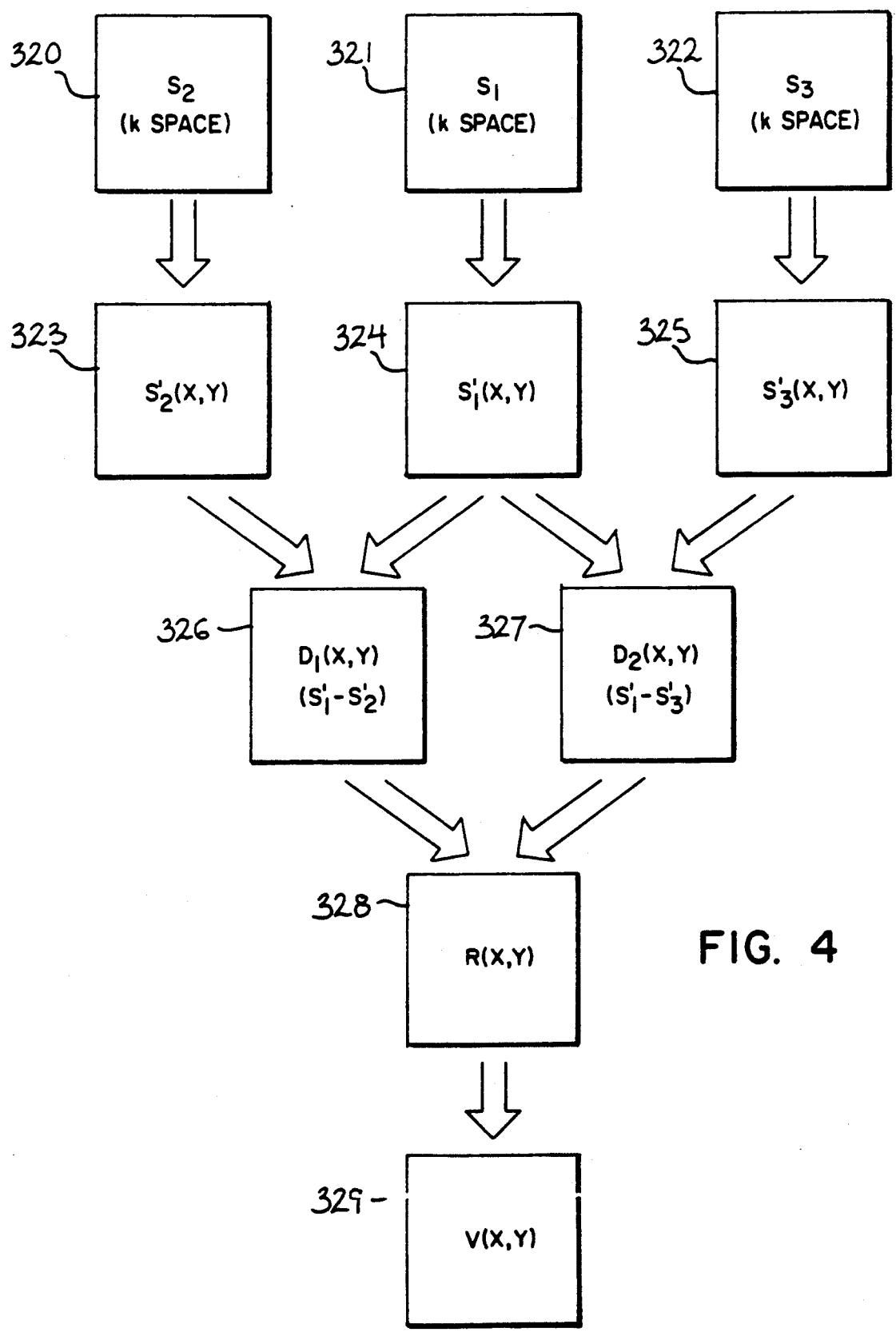
FIG. 4 is a pictorial representation of how a velocity image is reconstructed from NMR data acquired using the pulse sequences of FIG. 3.

The processing of the three data sets $S_1$, $S_2$ and $S_3$ to decompose each voxel into static and moving components and to produce a velocity image is illustrated in FIG. 4. All of the processing is carried out in the main computer 101 under the direction of instructions in a stored program. The three data sets $S_1$, $S_2$ and $S_3$ of acquired NMR data are stored as 256 by 256 arrays of complex numbers indicated by blocks 320, 321 and 322. The first step in the process is to perform a two-dimensional, complex Fourier transform on each of these data sets to transform the images they represent from k-space to real space. This is the same transformation used to produce conventional NMR images and the results are complex images $S_1'$, $S_2'$ and $S_3'$ and they are stored in three arrays indicated by blocks 323–325.

The difference between the transformed signals $S_1'$ and $S_2'$ is then calculated and the results are stored in a 256×256 element difference array 326. Each element in the $S_1'$ and $S_2'$ arrays 323 and 324 is a complex number and the real and imaginary parts of each element in $S_2'$ array 323 is subtracted from the respective real and imaginary parts of each corresponding element in $S_1'$ array 324 to form the elements $D_1(x,y)$ in the difference array 326. A similar procedure is then followed to calculate the difference between the transformed $S_1'$ and $S_3'$ signals to produce the elements $D_2(x,y)$ in the 256×256 element difference array 327.

The values in the difference arrays 326 and 327 are then used to calculate the elements of a 256×256 element ratio array 328. Each element $R(x,y)$ in the ratio array 328 is calculated by determining the negative of the complex ratio of the corresponding elements in the difference arrays 326 and 327.

$$R(x, y) = - \frac{D_1(x, y)}{D_2(x, y)} \quad (11)$$

The final step in the processing is to calculate the elements $V(x,y)$ of a 256×256 element velocity array 329. This is accomplished by dividing the phase of each element $R(x,y)$ of the ratio array 328 by a constant value as follows:

$$V(x,y) = phase\ \{R(x,y)\}/\gamma \Delta M_1; \quad (12)$$

where $\gamma$ is the gyromagnetic ratio and $\Delta M_1$ is the incremental magnetic field gradient moment. The elements $V(x,y)$ can then be used to produce an image in the conventional manner by mapping each element $V(x,y)$ to a corresponding pixel in the display.

Figure 5:
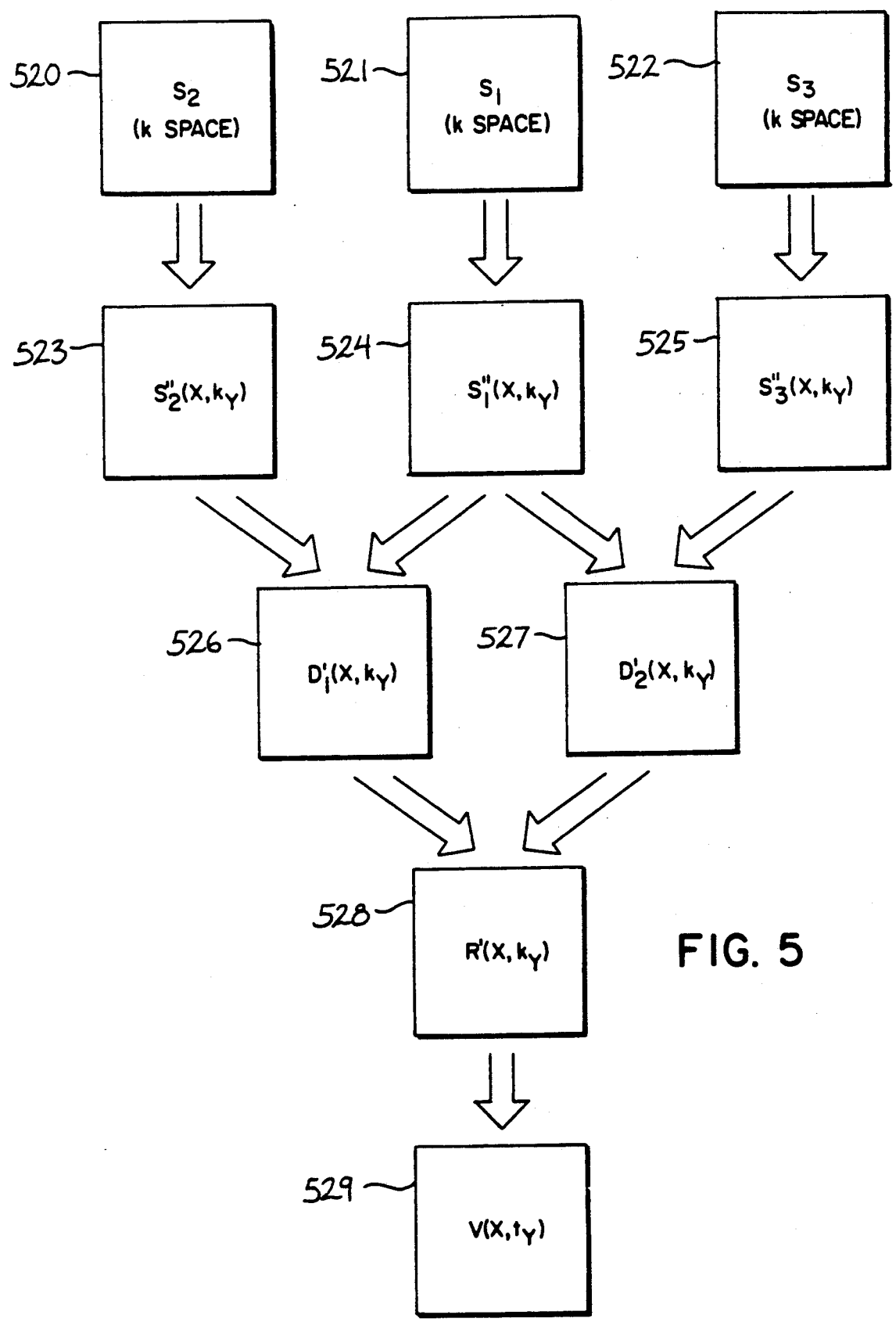
FIG. 5 is a pictoral representation of an alternative method for reconstructing an image from the acquired NMR data.

The processing steps described above allow each voxel in the object to be decomposed into static and moving signal components. As was stated earlier, if the motion in a voxel is not constant for each view that comprises the scan, artifacts will result. Also, the time dependence of the motion will not be readily apparent. The following data processing steps allow the time varying flow to be examined from the acquired data, $S_1$, $S_2$, and $S_3$. Again, the processing is carried out in the main computer 101 under the direction of instructions in a stored program, as illustrated in FIG. 5. The three data sets $S_1$, $S_2$, and $S_3$ of acquired NMR data are stored as 256 by 256 arrays of complex numbers indicated by blocks 520, 521, and 522, with each row being the data acquired for each phase encoding value, and each column being a point in time during the signal read-out. One dimensional Fourier Transforms are performed on those data in the row direction to convert k-space data ($S_1$, $S_2$, and $S_3$) to data in a hybrid space where one direction in the array corresponds to the spatial read-out direction (real space) while the other direction is still phase encoding value (k-space).

The results of the one dimensional transforms are termed $S_1''$, $S_2''$, and $S_3''$ and are stored in blocks 523, 524, and 525.

The complex number at a particular location $(x,k_y)$ contains information from all the spins in a column of the object at an x location corresponding to its horizontal location in the block 524. The contribution from spins at different y locations in the column have different relative phase shifts caused by the phase encoding gradient value used. Let $S_s$ be the total signal received from the static spins in the column including the effects of the phase encoding gradient. Similarly, let $S_m$ be the total signal from moving spins. $S_1''(x,k_y)$ is, therefore equal to $S_s + S_m$.

The complex number at the same location $(x,k_y)$ in the $S_2''$ also contains information about the same column of spins and also has the effects from the use of the phase encoding gradient. The contribution from static spins in the column is $S_s$, the same as that in $S_1''$ since the pulse sequence change (FIG. 3A vs. FIG. 3B) has no effect on static signal. However, the moving spins will have an incremental phase of $\phi$ due to the altered first moment; thus the contribution from moving spins is $S_m e^{i\phi}$ and $S_2''(x,k_y) = S_s + S_m e^{i\phi}$. Similarly, $S_3''(x,k_y) = S_s + S_m e^{-i\phi}$.

The average velocity of moving spins in each column and at each phase encoding may be calculated from $S_1''$, $S_2''$ and $S_3''$. First, the complex difference $(S_2'' - S_1'')$ is calculated and stored as $D_1''$ in block 526, and the complex difference $(S_3'' - S_1'')$ is calculated and stored as $D_2''$ in block 527. The negative complex ratio $R'$ is calculated as:

$$R'(x, k_y) = - \frac{D_1''(x, k_y)}{D_2''(x, k_y)} \quad (13)$$

and is stored in 528. The velocity of the moving spins in each column is then calculated as:

$$v(x, k_y) = \frac{phase\{R'(x, k_y)\}}{\gamma \Delta M_1} \quad (14)$$

The advantage of acquiring the NMR data $S_1$, $S_2$, and $S_3$ in an interleaved manner should now be clear. In this interleaved acquisition, the views for the three data sets at the same phase encoding value are acquired at approximately the same time ($t_y$). Even if the velocity of motion varies throughout the scan, these three measurements should be made while the spins are moving at a relatively constant velocity $v(x,t_y)$. Thus, the values in block 529 represent the velocity of moving spins in a column of spins at an x position corresponding to the horizontal location in the array, and at a time $t_y$ during the scan corresponding to the vertical position in the array.

The data acquired and used in the processing steps illustrated in FIG. 5 can still be used for the production of conventional images and/or for the production of images using the method of FIG. 4.

The present invention can be practiced through the use of gradients, but without the use of imaging. For example, the velocity flow in a tube surrounded by static fluid can be measured by use of three NMR sequences: one yielding a reference measurement, $S_1$, a second, $S_2$, in which the first moment of the gradient waveform in the direction of flow is increased by $\Delta M_1$ and a third, $S_3$, in which the first moment of the gradient is decreased by $-\Delta M_1$ with respect to that of the reference measurement. The velocity of flow v is then given by:

$$v = \frac{\text{phase}\left(-\frac{(S_2 - S_1)}{(S_3 - S_1)}\right)}{\gamma \Delta M_1} \quad (15)$$

I claim:

1. An NMR system for measuring the velocity of flowing spins, the combination comprising:
    means for applying a polarizing magnetic field to the flowing spins;
    means for executing a first NMR measurement cycle in which an RF excitation field is applied to the moving spins and an NMR signal $S_1$ is acquired;
    means for executing a second NMR measurement cycle which is substantially the same as the first NMR measurement cycle except that a motion encoding magnetic field gradient having an incremental first moment $\Delta M_1$ is applied to the excited moving spins and an NMR signal $S_2$ is acquired;
    means for executing a third NMR measurement cycle which is substantially the same as the first NMR measurement cycle except that a motion encoding magnetic field gradient having an incremental first moment $-\Delta M_1$ is applied to the excited moving spins and an NMR signal $S_3$ is acquired;
    means for calculating the difference between a signal derived from $S_1$ and a signal derived from $S_2$ to produce a first difference signal $D_1$;
    means for calculating the difference between a signal derived from $S_1$ and a signal derived from $S_3$ to produce a second difference signal $D_2$; and
    means for calculating the velocity of the moving spins from the difference signals $D_1$ and $D_2$.

2. The NMR System as recited in claim 1 in which the means for calculating the velocity of the moving spins includes:
    means for calculating the negative of the ratio between the first difference signal $D_1$ and the second difference signal $D_2$ to produce a ratio signal R; and
    means for calculating the velocity of the moving spins from the ratio signal R.

3. The NMR system as recited in claim 1 in which the first, second and third measurement cycles are each repeated a plurality of times with different position encoding magnetic field gradients to produce respective sets of NMR signals $S_1$, $S_2$, and $S_3$, and a set of velocity values are calculated; and
    the NMR system includes a display for producing an image from the calculated velocity values.

4. The NMR system as recited in claim 3 which includes means for performing a Fourier transformation on the NMR signals $S_1$, $S_2$ and $S_3$ and the difference values $D_1$ and $D_2$ are calculated on the transformed NMR signals.

5. A method for measuring the flow of moving spins with an NMR system, the steps comprising:
    performing a first NMR measurement cycle in which the magnetic field gradients produced by the NMR system have a reference first moment and a reference NMR signal $S_1$ is produced;
    performing a second NMR measurement cycle in which the magnetic field gradients produced by the NMR system have a moment that differs from the reference first moment by an incremental amount $\Delta M_1$ and an NMR signal $S_2$ is produced;
    performing a third NMR measurement cycle in which the magnetic field gradients produced by the NMR system have a first moment that differs from the reference first moment by an incremental amount $-\Delta M_1$ and an NMR signal $S_3$ is produced;
    calculating a first difference value $D_1$ between a signal derived from $S_1$ and a signal derived from $S_2$;
    calculating a second difference value $D_2$ between a signal derived from $S_1$ and a signal derived from $S_3$; and
    calculating the flow of the moving spins using the two difference values $D_1$ and $D_2$.

6. The method as recited in claim 5 in which the velocity of the flowing spins is measured by employing gradient pulses in the first measurement cycle have a substantially zero first moment and the second and third measurement cycles employ gradient pulses that have respective first moments of $\Delta M_1$ and $-\Delta M_1$.

7. The method as recited in claim 6 in which the velocity of the flowing spins is determined by calculating the negative of the ratio of the difference values $D_1$ and $D_2$ and dividing the phase of the result by a constant proportional to the value of the first moment $\Delta M_1$.

* * * * *